(12) United States Patent  
Lin

(10) Patent No.: US 11,474,148 B2  
(45) Date of Patent: Oct. 18, 2022

(54) AUTOMATIC DETECTION CIRCUIT FOR INTEGRATED CIRCUIT AND AUTOMATIC DETECTION METHOD FOR THE SAME

(71) Applicant: REALTEK SEMICONDUCTOR CORP., Hsinchu (TW)

(72) Inventor: Chung-Chang Lin, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 17/458,845

(22) Filed: Aug. 27, 2021

(65) Prior Publication Data

US 2022/0146570 A1 May 12, 2022

(30) Foreign Application Priority Data

Nov. 6, 2020 (TW) .................................. 109138875

(51) Int. Cl.
*G01R 31/28* (2006.01)
*H03K 17/56* (2006.01)

(52) U.S. Cl.
CPC ......... *G01R 31/2884* (2013.01); *H03K 17/56* (2013.01)

(58) Field of Classification Search
CPC ............................ G01R 31/2884; H03K 17/56

USPC ..................................... 324/750.3, 537, 500
See application file for complete search history.

(56) References Cited

U.S. PATENT DOCUMENTS

| 7,299,236 B2* | 11/2007 | Kang ............. | G01R 31/318335 |
| | | | 707/999.102 |
| 2018/0251102 A1* | 9/2018 | Han ........................ | B60L 53/80 |
| 2018/0348299 A1* | 12/2018 | Mistry ............. | G01R 31/31908 |

* cited by examiner

*Primary Examiner* — Giovanni Astacio-Oquendo
(74) *Attorney, Agent, or Firm* — Li & Cai Intellectual Property (USA) Office

(57) ABSTRACT

An automatic detection circuit for an integrated circuit and an automatic detection method for the same are provided. The automatic detection circuit is suitable for a system-on-chip (SoC). A control unit of the automatic detection circuit enters an automatic detection mode to: switch a first dynamic switching circuit to connect a main bus to a virtual host circuit; switch a second dynamic switching circuit to connect memory interfaces and intellectual property circuit to a virtual input and output circuit; send detection vectors to the virtual host circuit to set and activate the memory interfaces and the intellectual property circuits; send the detection vectors to the virtual I/O circuit to replace external memory and external equipment for sending and receiving signals; and compare signals received by the virtual host circuit or signals received by the virtual input and output circuit with predetermined signal data to generate a detection result.

14 Claims, 2 Drawing Sheets

AUTOMATIC DETECTION CIRCUIT FOR INTEGRATED CIRCUIT AND AUTOMATIC DETECTION METHOD FOR THE SAME

CROSS-REFERENCE TO RELATED PATENT APPLICATION

This application claims the benefit of priority to Taiwan Patent Application No. 109138875, filed on Nov. 6, 2020. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an automatic detection circuit for an integrated circuit (IC) and an automatic detection method for the same, and more particularly to an automatic detection circuit for an IC and an automatic detection method for the same that can simplify development, verification, mass production and testing procedures for ICs.

BACKGROUND OF THE DISCLOSURE

In a development stage of a system on chip (SoC) of an integrated circuit (IC), it is usually necessary to prepare various IC verification equipment and develop relevant verification programs.

In detail, in the mass production and testing stages, in addition to a scan test and a memory built-in self-test (MBIST), a functional pattern testing is also required. It is usually necessary to develop various IC testing equipment and testing programs, and perform testing through the testing equipment and compare testing results.

However, as the functions and complexity of the SoC increase, the quantity and complexity of verification equipment and verification programs also increase, so that a longer verification time is required, thereby affecting the IC development timeline and increasing costs required for the verification.

However, after the mass production, testings and shipments of the ICs, some ICs may still have problems during system testing or actual use. At this time, it is usually necessary to send the ICs back to the original factory for testing. As a result, such problems cannot be detected and found immediately, and a lot of testing time, manpower and material costs are also required.

SUMMARY OF THE DISCLOSURE

In response to the above-referenced technical inadequacies, the present disclosure provides an automatic detection circuit for an IC and an automatic detection method for the same that can simplify development, verification, mass production and testing procedures for ICs.

In one aspect, the present disclosure provides an automatic detection circuit for an integrated circuit, suitable for a system-on-chip (SoC) disposed on a printed circuit board (PCB), the SoC including a processor, a main bus, and a plurality of memory interfaces and a plurality of silicon intellectual property circuits connected to the main bus, and a chip controller. The automatic detection circuit includes a first dynamic switching circuit, a second dynamic switching circuit, a virtual host circuit, a virtual input and output (I/O) circuit, a detection vector unit and a control unit. The first dynamic switching circuit is connected between the processor and the main bus. The second dynamic switching circuit is connected to the plurality of memory interfaces and the plurality of silicon intellectual property circuits, the plurality of memory interfaces are respectively connected to a plurality of external memories through the second dynamic switching circuit, and the plurality of silicon intellectual property circuits are respectively connected to a plurality of external equipment through the second dynamic switching circuit. The virtual host circuit is connected to the first dynamic switching circuit and configured to replace the processor during operation to set up the plurality of memory interfaces and the plurality of silicon intellectual property circuits. The virtual I/O circuit is connected to the second dynamic switching circuit and configured to replace the plurality of external memories and the plurality of external equipment to transmit signals during operation, and to receive signals transmitted from the plurality memory interfaces and the plurality of silicon intellectual property circuits. The detection vector unit is configured to generate a plurality of detection vectors required for detecting the SoC. The control unit is connected to the chip controller, the first dynamic switching circuit, the second dynamic switching circuit, the virtual host circuit, the virtual I/O circuit, and the detection vector unit, and configured to enter an automatic detection mode to: control the first dynamic switching circuit to switch a control of the main bus from the processor to the virtual host circuit; switch the second dynamic switching circuit to connect the plurality of memory interfaces and the silicon intellectual property circuits to the virtual I/O circuit; transmit the plurality of detection vectors to the virtual host circuit to configure the virtual host circuit to set and activate the plurality of memory interfaces and the plurality of silicon intellectual property circuits according to the plurality of detection vectors; transmit the plurality of detection vectors to the virtual I/O circuit, so as to control the virtual I/O circuit to replace the plurality of external memories and the plurality of external equipment to transmit signals, and to receive signals transmitted from the plurality of memory interfaces and the plurality of silicon intelligence circuits; and compare the signals received by the virtual host circuit or the signals received by the virtual I/O circuit with a predetermined signal data to generate a detection result.

In another aspect, the present disclosure provides an automatic detection method for an integrated circuit, suitable for a SoC on a PCB, the SoC includes a processor, a main bus, a plurality of memory interfaces and a plurality of silicon intellectual property circuits connected to the main bus, and a chip controller, and the automatic detection method includes: configuring a control unit to enter an automatic detection mode to: control a first dynamic switching circuit connected between the processor and the main bus to switch a control of the main bus from the processor to the virtual host circuit; switch a second dynamic switching circuit connected to the plurality of memory interfaces and the plurality of silicon intellectual property circuits, to connect the plurality of memory interfaces and the silicon intellectual property circuits to a virtual I/O circuit, in which the plurality of memory interfaces are respectively connected to a plurality of external memories through the second dynamic switching circuit, the plurality of silicon intellectual property circuits are respectively connected to a plurality of external equipment through the second dynamic switching circuit, and the virtual I/O circuit connected to the second dynamic switching circuit and the control unit; obtain a plurality of detection vectors for detecting the SoC from a detection vector unit, and transmit the plurality of detection vectors to the virtual host circuit to configure the virtual host circuit to set and activate the plurality of memory interfaces and the plurality of silicon intellectual property circuits according to the plurality of detection vectors; transmit the plurality of detection vectors to the virtual I/O circuit, so as to control the virtual I/O circuit to replace the plurality of external memories and the plurality of external equipment to transmit signals, and to receive signals transmitted from the plurality of memory interfaces and the plurality of silicon intelligence circuits; and compare the signals received by the virtual host circuit or the signals received by the virtual I/O circuit with predetermined signal data to generate a detection result.

Therefore, the automatic detection circuit for the IC and the automatic detection method for the same provided by the present disclosure can eliminate the above-mentioned disadvantages in combination with circuit design, simplify development, verification, mass production and testing processes for the ICs, shorten the development time required in each stage and reduce the required cost, and perform dynamic self-testing in an actual use stage to detect and find issues immediately.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
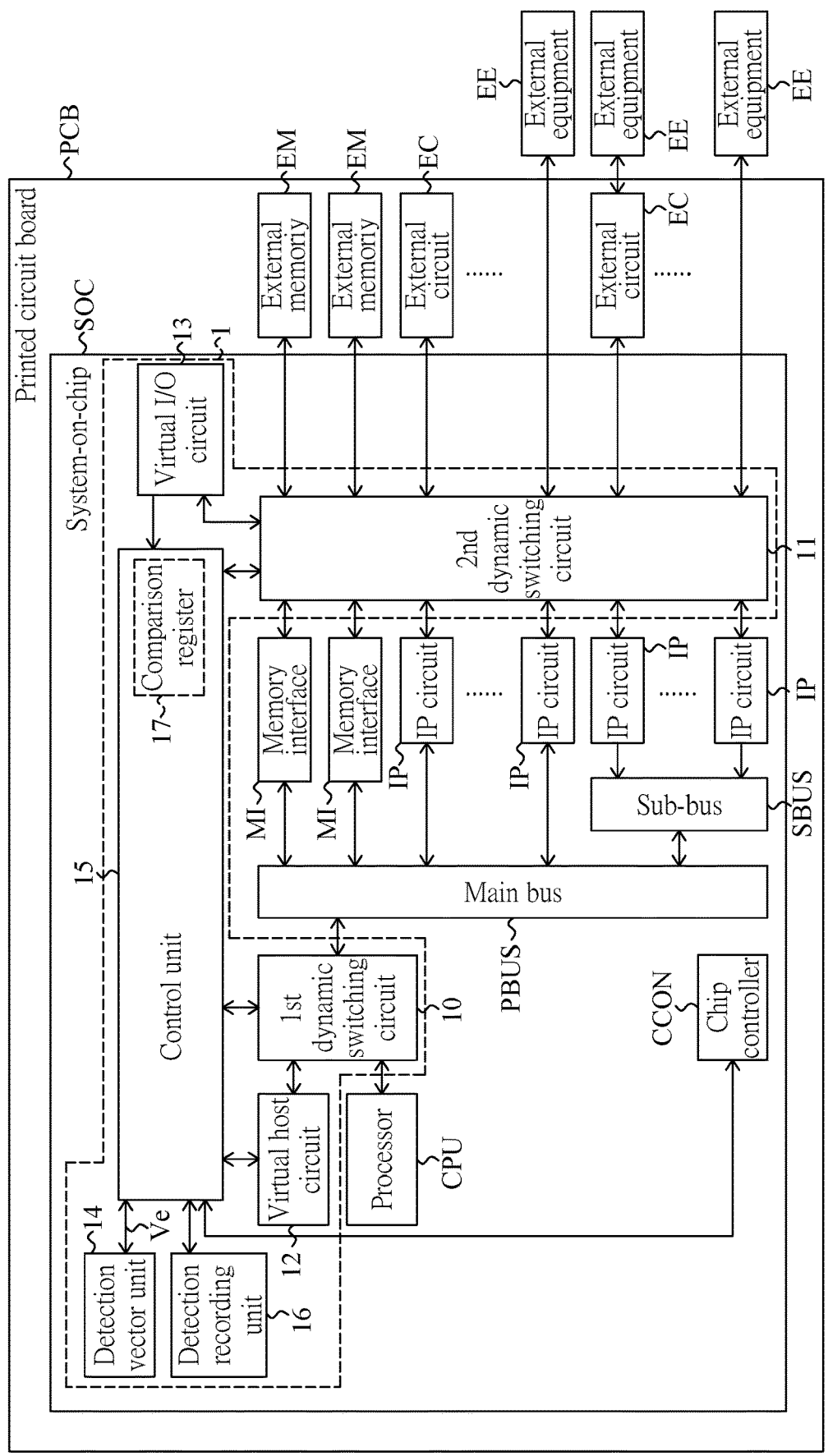
FIG. 1 is a functional block diagram of an automatic detection circuit for an integrated circuit according to an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

FIG. 1 is a functional block diagram of an automatic detection circuit for an integrated circuit according to an embodiment of the present disclosure. Referring to FIG. 1, an embodiment of the present disclosure provides an automatic detection circuit 1 for integrated circuit (IC), which is suitable for a system-on-chip SoC arranged on a printed circuit board PCB. The SoC includes a processor CPU, a main bus PBUS, a plurality of memory interfaces MI and a plurality of silicon intellectual property circuit IP connected to the main bus PBUS, and a chip controller CCON.

The automatic detection circuit 1 includes a first dynamic switching circuit 10, a second dynamic switching circuit 11, a virtual host circuit 12, a virtual input/output (I/O) circuit 13, a detection vector unit 14 and a control unit 15.

The first dynamic switching circuit 10 is connected between the processor CPU and the main bus MBUS, and the second dynamic switching circuit 11 is connected to the memory interfaces MI and the silicon intellectual property (IP) circuits IP. The plurality of memory interfaces MI are respectively connected to a plurality of external memories EM through the second dynamic switching circuit 11, and the silicon intellectual property circuits IP are connected to a plurality of external equipment EE or external circuits EC through the second dynamic switching circuit 11, or connected to an external equipment EE through an external circuit EC.

In addition, in some embodiments, the SOC further includes a sub-bus SBUS connected between the main bus PBUS and a part of the silicon intellectual property circuit IP, but the present disclosure is not limited thereto. The first dynamic switching circuit 10 and the second dynamic switching circuit 11 can respectively include a plurality of switching circuits controlled by the control unit 15.

The main bus PBUS and the sub-bus SBUS can be respectively, for example, a general internal bus such as an internal bus compatible with open core protocol (OCP), Advanced eXtensible Interface (AXI) protocol, and the like.

The first dynamic switching circuit 10 is configured to switch controls of the plurality of memory interfaces MI and the plurality of silicon intellectual property circuits IP between the processor CPU and the virtual host circuit 12, and the second dynamic switching circuit 11 guides signals in external transmissions of the plurality of silicon intellectual property circuits IP and the plurality memory interfaces MI to the virtual I/O circuit 13.

It should be noted that the full name of silicon intellectual property is intellectual property core, which refers to a reusable module provided by a party in forms of logic unit and chip design in the reusable design methodology of integrated circuits. The silicon intellectual property usually has passed a design verification, and designers can design on the basis of silicon intellectual property, which can shorten the design cycle.

The virtual host circuit 12 is connected to the first dynamic switching circuit 10, and is configured to replace the processor CPU to set the plurality of memory interfaces MI and the plurality of silicon intellectual property circuits IP during operation.

The virtual I/O circuit 13 is connected to the second dynamic switching circuit, and is configured to replace the plurality of external memories EM and the plurality of external equipment EE to transmit signals during operation, and to receive signals transmitted from the plurality memory interfaces MI and the plurality of silicon intelligence circuits IP.

The detection vector unit 14 is configured to generate a plurality of detection vectors Ve required for detecting the SOC. The plurality of detection vectors Ve can include, for example, a plurality of set activation detection vectors and a plurality of input and output (I/O) detection vectors. The plurality of set activation detection vectors are provided for the virtual host circuit 12 to set and activate the plurality of memory interfaces MI and the plurality of silicon intellectual property circuits IP, and the plurality of I/O detection vectors are used for the virtual I/O circuit to replace the plurality of external memories EM and the plurality of external devices EE to transmit signals, and to receive signals transmitted from the plurality of memory interfaces MI and the plurality of silicon intellectual property circuits IP.

The control unit 15 is connected to the chip controller CCON, the first dynamic switching circuit 10, the second dynamic switching circuit 11, the virtual host circuit 12, the virtual input/output circuit 13, and the detection vector unit 14. The control unit 15 can be configured to enter the automatic detection mode according to a pin configuration. For example, in verification and mass production test stages of the IC, the IC can be set to an automatic detection mode through a pin configuration, and the chip controller CCON can control the control unit 15 to enter the automatic detection mode according to the pin configuration. Alternatively, in an actual use stage of the IC, when a system where the IC is located is in an idle state, the control unit 15 can be dynamically switched to the automatic detection mode through the chip controller CCON after a predetermined time elapsed. After the detection is completed or the detection is interrupted, the chip controller CCON returns to a normal operation mode. The control unit 15 can be, for example, a hardware such as a central processing unit and a microcontroller.

Figure 2:
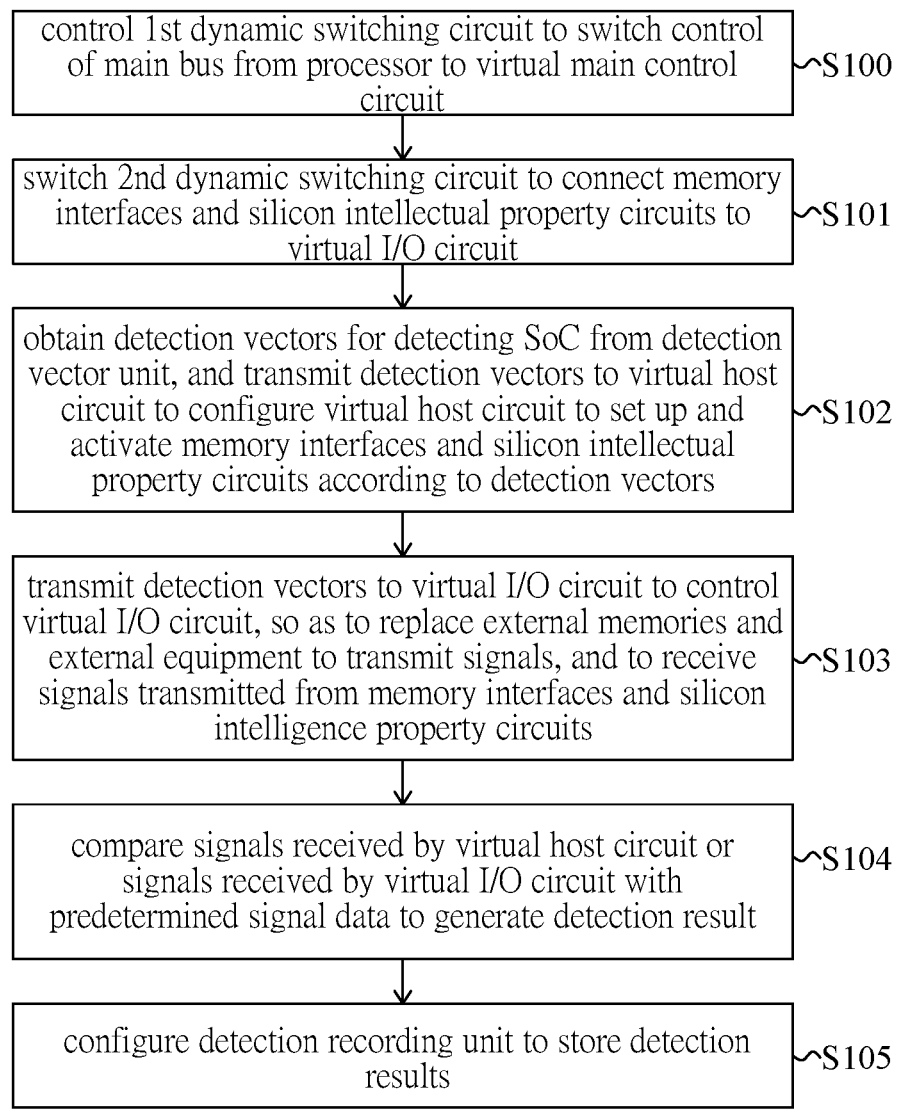
FIG. 2 is a flowchart of an automatic detection method for an integrated circuit according to an embodiment of the present disclosure.

After describing a basic structure of the automatic detection circuit 1 of the present disclosure, the automatic detection method for IC of the present disclosure is further explained. Referring to FIG. 2, which is a flowchart of an automatic detection method for an integrated circuit according to an embodiment of the present disclosure. As shown in FIG. 2, the automatic detection method can include configuring the control unit 15 to enter the automatic detection mode to perform the following steps:

Step S100: control the first dynamic switching circuit 10 to switch the control of the main bus PBUS from the processor CPU to the virtual main control circuit 12.

Step S101: switch the second dynamic switching circuit 11 to connect the plurality of memory interface MI and the plurality of silicon intellectual property circuits IP to the virtual I/O circuit 13.

Step S102: obtain a plurality of detection vectors Ve for detecting the SoC from a detection vector unit 14, and transmit the plurality of detection vectors Ve to the virtual host circuit 12 to configure the virtual host circuit 12 to set and activate the plurality of memory interfaces MI and the plurality of silicon intellectual property circuits IP according to the plurality of detection vectors Ve. For example, the plurality of detection vector Ve can be stored by the detection vector unit 14, or the detection vector unit 14 can obtain the plurality of detection vectors Ve from an external input signal source (for example, provided by a user).

Step S103: transmit the plurality of detection vectors Ve to the virtual I/O circuit 13, so as to control the virtual I/O circuit 13 to replace the plurality of external memories EM and the plurality of external equipment EE to transmit signals, and to receive signals transmitted from the plurality of memory interfaces MI and the plurality of silicon intelligence property circuits IP.

After each of the silicon intellectual property circuits IP is activated, the automatic detection method proceeds to step S104: compare the signals received by the virtual host circuit 12 or the signals received by the virtual I/O circuit 13 with predetermined signal data to generate a detection result.

As shown in FIG. 1, the automatic detection circuit 1 can further include a comparison register 17 for storing the predetermined signal data. The comparison register 17 can be included in the control unit 15 as shown in FIG. 1, or can be independently provided in the automatic detection circuit 1 and accessed by the control unit 15. The present disclosure is not limited thereto.

As shown in FIG. 1, in a specific embodiment, the automatic detection circuit 1 further includes a detection recording unit 16 for storing detection results. Therefore, optionally, after step S104, the automatic detection method can further proceed to step S105: configure a detection recording unit to store the detection results.

In other words, after each of the silicon intellectual property circuits IP is activated and completed, signals transmitted from the plurality of silicon intellectual property circuits IP and originally scheduled to be transmitted to I/O interfaces (that is, interfaces connected with the external memories EM, the external circuits EC or the external equipment EE) are compared to generate the test results. Alternatively, the virtual host circuit 12 can be used to read and compare contents of registers of the silicon intellectual property circuits IP and related circuits to determine whether the test results of the circuit are normal, store the detection results (including the error code) in the detection recording unit for subsequent observation and interpretation, and implement required follow-up actions accordingly.

In conclusion, the automatic detection circuit for the IC and the automatic detection method for the same provided by the present disclosure can eliminate the above-mentioned disadvantages in combination with circuit design, simplify development, verification, mass production and testing processes for the ICs, shorten the development time required in each stage and reduce the required cost, and perform dynamic self-testing in an actual use stage to detect and find issues immediately.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An automatic detection circuit for an integrated circuit, suitable for a system-on-chip (SoC) disposed on a printed circuit board (PCB), the SoC including a processor, a main bus, and a plurality of memory interfaces and a plurality of silicon intellectual property circuits connected to the main bus, and a chip controller, the automatic detection circuit comprising:
- a first dynamic switching circuit connected between the processor and the main bus;
- a second dynamic switching circuit connected to the plurality of memory interfaces and the plurality of silicon intellectual property circuits, wherein the plurality of memory interfaces are respectively connected to a plurality of external memories through the second dynamic switching circuit, the plurality of silicon intellectual property circuits are respectively connected to a plurality of external equipment through the second dynamic switching circuit;
- a virtual host circuit connected to the first dynamic switching circuit and configured to replace the processor during operation to set up the plurality of memory interfaces and the plurality of silicon intellectual property circuits;
- a virtual input and output (I/O) circuit connected to the second dynamic switching circuit and configured to replace the plurality of external memories and the plurality of external equipment to transmit signals during operation, and to receive signals transmitted from the plurality memory interfaces and the plurality of silicon intellectual property circuits;
- a detection vector unit configured to generate a plurality of detection vectors required for detecting the SoC; and
- a control unit connected to the chip controller, the first dynamic switching circuit, the second dynamic switching circuit, the virtual host circuit, the virtual I/O circuit, and the detection vector unit, and configured to enter an automatic detection mode to:
  - control the first dynamic switching circuit to switch a control of the main bus from the processor to the virtual host circuit;
  - switch the second dynamic switching circuit to connect the plurality of memory interfaces and the silicon intellectual property circuits to the virtual I/O circuit;
  - transmit the plurality of detection vectors to the virtual host circuit to configure the virtual host circuit to set and activate the plurality of memory interfaces and the plurality of silicon intellectual property circuits according to the plurality of detection vectors;
  - transmit the plurality of detection vectors to the virtual I/O circuit, so as to control the virtual I/O circuit to replace the plurality of external memories and the plurality of external equipment to transmit signals, and to receive signals transmitted from the plurality of memory interfaces and the plurality of silicon intelligence circuits; and
  - compare the signals received by the virtual host circuit or the signals received by the virtual I/O circuit with a predetermined signal data to generate a detection result.

2. The automatic detection circuit according to claim 1, further comprising a detection recording unit for storing the detection result.

3. The automatic detection circuit according to claim 1, wherein the control unit enters the automatic detection mode according to a pin configuration.

4. The automatic detection circuit according to claim 1, wherein the plurality of detection vectors include a plurality of set activation detection vectors and a plurality of input and output (I/O) detection vectors, and the virtual host circuit uses the plurality of set activation detection vectors to set up and activate the plurality of memory interfaces and the plurality of silicon intellectual property circuits, and the virtual I/O circuit uses the plurality of I/O detection vectors to replace the plurality of external memories and the plurality of external equipment for transmitting signals, and for receiving signals transmitted from the plurality of memory interfaces and the plurality of silicon intellectual property circuits.

5. The automatic detection circuit according to claim 1, wherein the detection vector unit stores the plurality of detection vectors.

6. The automatic detection circuit according to claim 1, wherein the detection vector unit obtains the plurality of detection vectors from an external input signal source.

7. The automatic detection circuit according to claim 1, further comprising a comparison register for storing the predetermined signal data.

8. An automatic detection method for an integrated circuit, suitable for a system-on-chip (SoC) on a printed circuit board (PCB), the SoC includes a processor, a main bus, a plurality of memory interfaces and a plurality of silicon intellectual property circuits connected to the main bus, and a chip controller, the automatic detection method comprising:
- configuring a control unit to enter an automatic detection mode to:
  - control a first dynamic switching circuit connected between the processor and the main bus to switch a control of the main bus from the processor to the virtual host circuit;
  - switch a second dynamic switching circuit connected to the plurality of memory interfaces and the plurality of silicon intellectual property circuits, so as to connect the plurality of memory interfaces and the silicon intellectual property circuits to a virtual I/O circuit, wherein the plurality of memory interfaces are respectively connected to a plurality of external memories through the second dynamic switching circuit, the plurality of silicon intellectual property circuits are respectively connected to a plurality of external equipment through the second dynamic switching circuit, and the virtual I/O circuit connected to the second dynamic switching circuit and the control unit;
  - obtain a plurality of detection vectors for detecting the SoC from a detection vector unit, and transmit the plurality of detection vectors to the virtual host circuit to configure the virtual host circuit to set and activate the plurality of memory interfaces and the plurality of silicon intellectual property circuits according to the plurality of detection vectors;
  - transmit the plurality of detection vectors to the virtual I/O circuit, so as to control the virtual I/O circuit to replace the plurality of external memories and the plurality of external equipment to transmit signals, and to receive signals transmitted from the plurality of memory interfaces and the plurality of silicon intelligence circuits; and compare the signals received by the virtual host circuit or the signals received by the virtual I/O circuit with predetermined signal data to generate a detection result.

9. The automatic detection method according to claim 8, further comprising configuring a detection recording unit to store the detection result.

10. The automatic detection method according to claim 8, further comprising configuring the control unit to enter the automatic detection mode according to a pin configuration.

11. The automatic detection method according to claim 8, wherein the plurality of detection vectors include a plurality of set activation detection vectors and a plurality of input and output (I/O) detection vectors, and the virtual host circuit uses the plurality of set activation detection vectors to set up and activate the plurality of memory interfaces and the plurality of silicon intellectual property circuits, and the virtual I/O circuit uses the plurality of I/O detection vectors to replace the plurality of external memories and the plurality of external equipment for transmitting signals, and for receiving signals transmitted from the plurality of memory interfaces and the plurality of silicon intellectual property circuits.

12. The automatic detection method according to claim 8, further comprising configuring the detection vector unit to store the plurality of detection vectors.

13. The automatic detection method according to claim 8, further comprising configuring the detection vector unit to obtain the plurality of detection vectors from an external input signal source.

14. The automatic detection method according to claim 8, further comprising configuring a comparison register to store the predetermined signal data.

* * * * *